United States Patent [19]

Franklin et al.

[11] Patent Number: 4,928,059
[45] Date of Patent: May 22, 1990

[54] SINUSOIDAL CURRENT SENSE AND SCALING CIRCUIT

[75] Inventors: Hugh L. Franklin, La Mirada; Leslie H. Whatley, Corona; George N. Klees, Anaheim, all of Calif.

[73] Assignee: Rockwell International Corporation, El Segundo, Calif.

[21] Appl. No.: 345,939

[22] Filed: May 1, 1989

[51] Int. Cl.⁵ .................. G01R 19/00; G01R 19/02
[52] U.S. Cl. ..................... 324/123 R; 324/72.5; 324/72; 324/123 C; 330/9
[58] Field of Search ............ 324/72, 72.5, 254, 123 R, 324/123 C, 127, 73 PC; 323/357; 340/664; 328/165; 330/9

[56] References Cited

U.S. PATENT DOCUMENTS

| | | |
|---|---|---|
| 3,710,135 | 1/1973 | Gilbert .................... 324/127 |
| 4,229,703 | 10/1980 | Bustin ..................... 330/9 |
| 4,262,543 | 4/1981 | Grebe, Jr. et al. ............ 330/9 |
| 4,714,890 | 12/1987 | Dechene et al. ............. 324/72 |
| 4,785,237 | 11/1988 | Cox ........................ 328/165 |

FOREIGN PATENT DOCUMENTS 0157577  7/1987  Japan ..................... 324/72.5

Primary Examiner—Reinhard J. Eisenzopf
Assistant Examiner—W. Burns
Attorney, Agent, or Firm—H. Fredrick Hamann; George A. Montanye; James F. Kirk

[57] ABSTRACT

A circuit for providing a scaled sinusoidal voltage proportional to a sinusoidal current referenced to a first reference potential. The scaled sinusoidal voltage is referenced to a second reference potential. A scaling resistor is connected between an operational amplifier inverting input terminal and the operational amplifier output terminal. A transformer has a primary winding in series with the sinusoidal current. A secondary winding has a first terminal coupled to the second reference potential and a second terminal coupled to the operational amplifier inverting input terminal. An integrator has an inverting input terminal coupled to the operational amplifier output terminal, a noninverting input terminal coupled to the second reference potential and an output terminal coupled to the operational amplifier noninverting input terminal. The operational amplifier provides an output voltage signal to maintain the operational amplifier inverting input terminal at substantially zero volts across the transformer secondary winding. The transformer has a substantially reduced number of secondary turns with a forced zero voltage across the secondary turns increasing the bandwidth over prior art techniques. The integrator responds to the scaled output voltage to provide an average offset bias signal to the operational amplifier noninverting input terminal to enable the operational amplifier to operate in its linear range.

4 Claims, 1 Drawing Sheet

SINUSOIDAL CURRENT SENSE AND SCALING CIRCUIT

BACKGROUND OF THE INVENTION

1. Field of the Invention

This invention relates to the field of instrument circuits for the measurement of sinusoidal current and, more particularly, to circuits having high accuracy and high stability for signals over a wide bandwidth. The invention, Current Measuring Circuit, conserves space and lowers cost by reducing the size of the associated current sense transformer.

2. Description of the Prior Art

Presently known current scaling circuits typically employ a current sense transformer having a secondary winding that is terminated by a scaling resistor. Conventional prior art circuits develop a small voltage across the terminating resistor. The maximum voltage to be developed across the terminating resistor and the frequency of the current to be measured, as well as the number of turns on the secondary, and the peak design flux density permitted by the core material, combine to control the required cross-sectional area of the core. Increasing the frequency of the current to be measured, or decreasing the required voltage to be supported on the terminating resistor reduces the required cross-sectional area of the core to be used in the transistor. The required voltage to be supported by the secondary was typically reduced by reducing the value of the terminating resistor to a limit that could be conveniently handled by subsequent amplification. Increasing the gain of subsequent amplification stages increased the sensitivity of prior art circuits to noise.

SUMMARY OF THE INVENTION

It is a major objective of this invention to provide an efficient, compact, reliable, solid state, current measuring circuit having a substantially zero voltage drop on its secondary winding at full-rated current.

It is another objective of this invention to increase the bandwidth of the current measuring circuit. The first method is to reduce the number of turns required on the secondary of the current sense transformer by using an operational amplifier gain stage. This increases bandwidth by raising the resonant frequency of the transformer. The second method is to force the secondary voltage to be essentially zero. This eliminates the effects of the distributed capacitance of the transformer and further increases the bandwidth of the transformer. The invention current measuring circuit comprises a transformer having a primary winding responsive to the sinusoidal current from a sinusoidal current source referenced to a first reference potential. The transformer also has a secondary winding having a first terminal coupled to a second reference potential and a second terminal for providing a scaled sinusoidal current having an amplitude essentially equal to the amplitude of the sinusoidal current passing through the primary winding times the ratio of N2/N1. N2 represents the number of turns on the secondary winding and N1 represents the number of turns on the primary winding.

A scaling means receives the scaled sinusoidal current and maintains the voltage at the transformer's secondary second terminal at essentially the same potential as the second reference potential. The scaling means provides an output voltage at an output terminal equal to the secondary current times a predetermined constant.

PREFERRED EMBODIMENT

Figure 1:
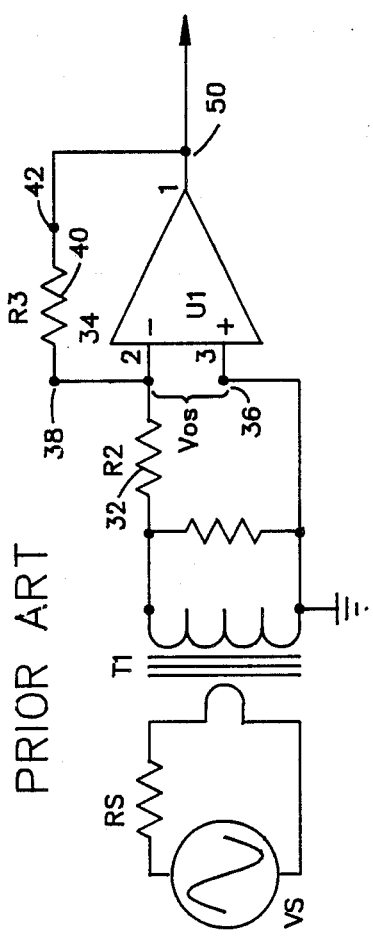
FIG. 1 is a schematic of a current sense transformer driven by a source VS and having a secondary terminated by resistor R1.

FIG. 1 shows a sinusoidal source 12 having a source resistance RS14 driving the primary of a current sense transformer T1 having input terminals 16 and 18. The current passing through the primary is I1. The amplitude of the input current I1 is equal to VS/RS. Current sense transformers, such as T1, are tightly coupled. The primary winding has N1 turns. The secondary winding has N2 turns. The secondary winding has terminals 20, 22. The secondary winding is terminated by resistor R1, 28. Current I2 passes through the secondary winding and through resistor R1. The voltage across the secondary winding is equal to the magnitude of the current I2 times the value of resistor R1. Current I2 is equal to I1 times N1/N2.

In a 100 milliamp application, input current I1 has a maximum value of 100 milliamperes. If the primary has one turn and that secondary winding has ten turns, current I2 will have a maximum value of ten milliamperes. If resistor R1 has a value of 100 ohms, one volt will be developed across resistor R1 in response to the input current I1.

Figure 2:
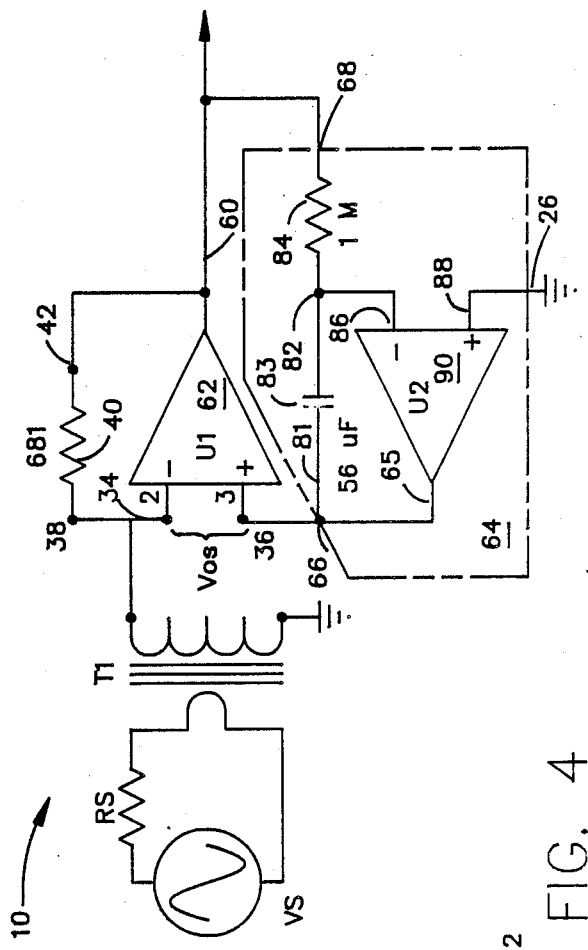
FIG. 2 is a schematic of the current sense transformer of FIG. 1 with an additional stage of amplification.

FIG. 2 is a schematic representing the circuit of FIG. 1 with an additional gain stage comprising operational amplifier U1, feedback resistor R3,40 and input resistor R2, 32. The gain of this stage is equal to R3/R2.

Figure 3:
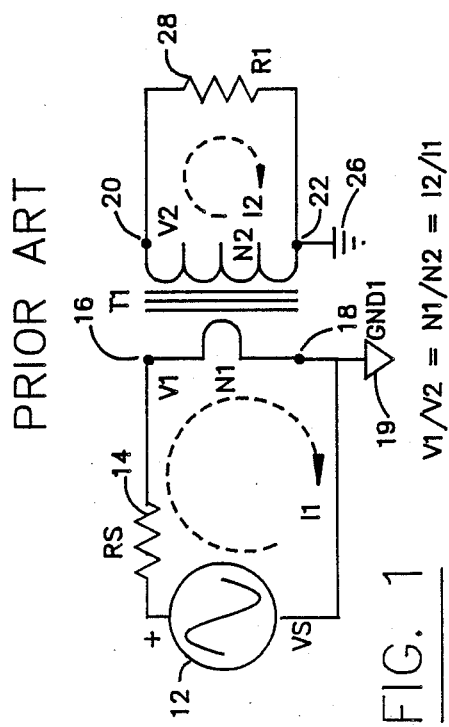
FIG. 3 is a schematic of the invention current measuring circuit showing a scaling means for maintaining essentially zero voltage across the secondary of the current sense transformer.

FIG. 3 shows the current measuring circuit for measuring a sinusoidal current from a sinusoidal current source comprising voltage source VS in series with source resistor RS. The sinusoidal current source is referenced to a first reference potential, such as GND1. The current measuring circuit provides a scaled sinusoidal voltage at output terminal 60 proportional to the sinusoidal current I1. The scaled sinusoidal voltage is referenced to a second referenced potential GND2 22.

The current measuring circuit 10 comprises a transformer, such as transformer T1, having a primary winding having a first terminal 16 and a second terminal 18. The primary winding is responsive, i.e., it receives and passes the sinusoidal current I1 from the sinusoidal current source, VS/RS, referenced to the first referenced potential, ground 119. A second winding has a first terminal 22 and a second terminal 20. The secondary first terminal is coupled to the second reference potential GND2 22. The secondary second terminal 20 provides a scaled sinusoidal current I2 having an amplitude essentially equal to the amplitude of the sinusoidal current I1 passing through the primary winding, terminal 16,18, times the ratio of the number of primary turns, N1, two secondary turns, N2. The number of secondary turns, N2, represents the number of turns on the secondary winding. N1 represents the number of turns on the primary winding.

The circuitry within phantom block 80 represents a scaling means for receiving the scaled sinusoidal current I2 via signal line 35 to node 34 secondary second terminal 20 at essentially the same potential as the second reference potential GND2 26. The scaling means also provides an output voltage at the output terminal 60 equal to the secondary current I2 (not shown) times a predetermined constant. Amplifier 62 is a conventional operational amplifier. Triangle 64 represents an integrator stage having an inverting input 68 and a noninverting input 70 and an output terminal 66. The scaling means 80 has an operational amplifier 62 having an output terminal, such as pin 1 connected to scaling means output terminal 60. The operational amplifier also has an inverting input terminal such as pin 2, 34 coupled to the transformer's secondary second terminal 20 and a noninverting input terminal, such as pin 3, 36. The operational amplifier has an input offset voltage Vos requirements between the inverting input terminal 34 and the noninverting input terminal 36.

The scaling means has a scaling resistor 40 having a first and second terminal 38, 42 respectively. The scaling resistor 40 first terminal is connected to the operational amplifier inverting input terminal 34 and scaling resistor second terminal 42 is coupled to the operational amplifier output terminal pin 1. The scaling means has an integrator 64 characterized to be responsive to the scaled output voltage at the operational amplifier output terminal 60. The integrator 64 provides an offset bias signal at its output terminal 66 to the operational amplifier noninverting input terminal 36 to enable the operational amplifier 62 to operate in its linear range.

Figure 4:
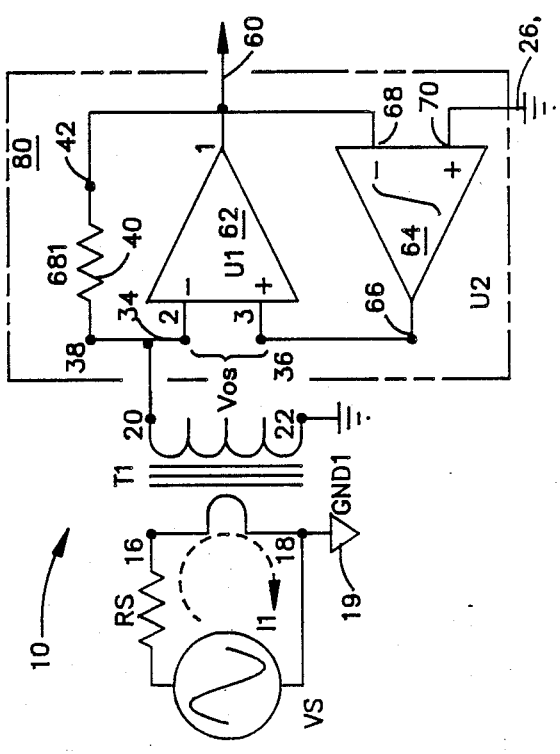
FIG. 4 is a detailed schematic of the invention current measuring circuit.

FIG. 4 is a detailed schematic of the preferred embodiment showing the integrator mechanization within phantom block 64. The integrator has an inverting input terminal 68 coupled to the amplifier output terminal 60 and a noninverting input terminal 88 coupled to the second reference potential GND2 26. The integrator 40 has an output terminal 66 coupled to the operational amplifier noninverting input terminal. The operational amplifier provides an output signal at its output terminal to maintain substantially zero volts across the transformer secondary winding. The integrator is characterized to be responsive to the scaled output voltage at the operational amplifier's output terminal 60 to provide an offset bias signal to the operational amplifier noninverting input terminal 36 to enable the operational amplifier to operate in its linear range.

The integrator within phantom block 64 has a capacitor 83 having a first and second terminal 81, 82 respectively. The integrator also has an input resistor 84 having a first and second terminal. The integrator also has an integrator operational amplifier 90 having an output terminal 65 coupled to the integrator output terminal 66 and a noninverting input terminal 88 coupled to the integrator noninverting input terminal and to GND2, 26. The capacitor first terminal 81 is coupled to the integrator output terminal 66. The capacitor second terminal is coupled to the integrator operational amplifier inverting terminal and to the input resistor first terminal. The input resistor second terminal is coupled to the integrator inverting input terminal 68 and then to the operational amplifier output terminal 60.

Although the invention method has been disclosed and illustrated in detail, it is to be clearly understood that the same is by way of illustration as an example only and is not to be taken by way of limitation. The spirit and scope of this invention is to be limited only by the terms of the appended claims.

I claim:

1. A current measuring circuit for measuring a sinusoidal current from a sinusoidal current source referenced to a first reference potential for providing a scaled sinusoidal voltage proportional to said sinusoidal current, said scaled sinusoidal voltage being referenced to a second reference potential, said current measuring circuit comprising:

a transformer having a primary winding responsive to said sinusoidal current from said sinusoidal current source referenced to said first reference potential, and a secondary winding having a first terminal coupled to said second reference potential and a second terminal for providing a scaled sinusoidal current having an amplitude essentially equal to the amplitude of said sinusoidal current passing through said primary winding times the ratio of N1/N2, where N2 represents the number of turns on the secondary winding and N1 represents the number of turns on said primary winding;

scaling means for receiving said scaled sinusoidal current, for maintaining the voltage at said transformer secondary second terminal at essentially the same potential as said second reference potential and for providing an output voltage at an output terminal equal to said secondary current times a predetermined constant.

2. The current measuring circuit of claim 1 wherein said scaling means further comprises:

an operational amplifier having an output terminal, an inverting input terminal coupled to said transformer secondary second terminal and a noninverting input terminal, said operational amplifier also having an input offset voltage requirement between said inverting input terminal and said noninverting input terminal;

a scaling resistor having a first and second terminal, said scaling resistor first terminal being connected to said operational amplifier inverting input terminal and said scaling resistor second terminal being coupled to said operational amplifier output terminal;

an integrator characterized to be responsive to said scaled output voltage at said operational amplifier output terminal to provide a offset bias signal to said operational amplifier noninverting input terminal to enable said operational amplifier to operate in its linear range.

3. A current measuring circuit for measuring a sinusoidal current from a sinusoidal current source referenced to a first reference potential for providing a scaled sinusoidal voltage proportional to said sinusoidal current, said scaled sinusoidal voltage being referenced to a second reference potential, said current measuring circuit comprising:

an operational amplifier having an output terminal, an inverting input terminal and a noninverting input terminal, said operational amplifier also having an input offset voltage requirement between said inverting input terminal and said noninverting input terminal;

a scaling resistor having a first and second terminal, said scaling resistor first terminal being connected for said operational amplifier inverting input terminal and said scaling resistor second terminal being coupled to said operational amplifier output terminal;

a transformer having a primary winding responsive to said sinusoidal current from said sinusoidal current source referenced to said first reference potential, and a secondary winding having a first terminal coupled to said second reference potential and a second terminal coupled to said operational amplifier inverting input terminal; and an integrator having an inverting input terminal coupled to said operational amplifier output terminal and a noninverting input terminal coupled to said second reference potential and an output terminal coupled to said operational amplifier noninverting input terminal;

whereby, said operational amplifier provides an output signal at its output terminal to maintain said operational amplifier inverting input terminal at substantially the same potential as said second reference potential via said scaling resistor thereby maintaining substantially zero volts across said transformer secondary winding; and said integrator is characterized to be responsive to said scaled output voltage at said operational amplifier output terminal to provide an offset bias signal to said operational amplifier noninverting input terminal to enable said operational amplifier to operate in its linear range.

4. The current measuring circuit of claim 3 wherein said integrator further comprises:

a capacitor having a first and second terminal; and an input resistor having a first and second terminal; and an integrator operational amplifier having an output terminal coupled to the integrator output terminal and an inverting input terminal and a noninverting input terminal coupled to the integrator noninverting input terminal;

said capacitor first terminal being coupled to said integrator output terminal and said capacitor second terminal and to said input resistor first terminal, said input resistor second terminal being coupled to said integrator inverting input terminal.

* * * * *